United States Patent [19]
Eide et al.

[11] Patent Number: 5,612,570
[45] Date of Patent: Mar. 18, 1997

[54] CHIP STACK AND METHOD OF MAKING SAME

[75] Inventors: Floyd K. Eide, Huntington Beach; John A. Forthun, Glendora; Harlan Isaak, Costa Mesa, all of Calif.

[73] Assignee: Dense-Pac Microsystems, Inc., Garden Grove, Calif.

[21] Appl. No.: 421,801

[22] Filed: Apr. 13, 1995

[51] Int. Cl.[6] .................................................. H01L 23/02
[52] U.S. Cl. ........................ 257/686; 257/685; 257/723; 257/777
[58] Field of Search ................................ 257/686, 774, 257/723, 777, 685

[56] References Cited

U.S. PATENT DOCUMENTS

| | | | |
|---|---|---|---|
| 4,956,694 | 9/1990 | Eide | 257/686 |
| 5,128,831 | 7/1992 | Fox, III et al. | 257/686 |
| 5,231,304 | 7/1993 | Solomon | 257/686 |
| 5,239,447 | 8/1993 | Cotues et al. | 257/686 |
| 5,311,401 | 5/1994 | Gates, Jr. et al. | 257/686 |
| 5,313,096 | 5/1994 | Eide | 257/686 |
| 5,373,189 | 12/1994 | Massit et al. | 257/686 |
| 5,384,689 | 1/1995 | Shen | 257/686 |

FOREIGN PATENT DOCUMENTS 60-194548  10/1985  Japan ................................ 257/686

OTHER PUBLICATIONS

Research Disclosure, Organic Card Device Carrier, 31318, May 1990, No. 313.

*Primary Examiner*—Mahshid D. Saadat
*Assistant Examiner*—T. M. Arroyo
*Attorney, Agent, or Firm*—Loeb & Loeb LLP

[57] ABSTRACT

An integrated circuit chip stack includes a stack of chip packages mounted on a substrate. Each chip package includes a plastic packaged chip mounted within a central aperture in a thin, planar frame by soldering leads at opposite ends of the plastic package to conductive pads on an upper surface of the frame adjacent the central aperture. Conductive traces and vias couple the conductive pads to other conductive pads on upper and lower surfaces of the frame adjacent outer edges thereof. The conductive pads adjacent the outer edges are soldered to the conductive pads of adjacent chip packages by dipping the edges of an assembled stack of the chip packages in solder. The chip stack thus formed is mounted on a substrate. Each chip package can be individually addressed by the substrate, such as to enable the chip therein, using a stair step arrangement of the conductive pads in which the pads on the opposite surfaces of each frame are coupled in offset fashion by vias extending through the frame.

18 Claims, 7 Drawing Sheets

CHIP STACK AND METHOD OF MAKING SAME

BACKGROUND OF THE INVENTION

1. Field of the Invention

The present invention relates to chip stacks in which a plurality of integrated circuit chips arranged in a stack are electrically connected with a supporting substrate board in a desired pattern.

2. History of the Prior Art

It is known to provide a chip stack in which a plurality of integrated circuit (IC) chips such as memory chips are mounted on a substrate board and are electrically interconnected in desired fashion. Typically, the chips have electrical contacts which are coupled in common or in parallel to contacts on the substrate board, as well as unique contacts which are coupled individually to the substrate board to the exclusion of the other chips.

A number of different arrangements have been provided for electrically interconnecting IC chips in a stack. For example, electrical conductors which may comprise thin-film metal on an insulating base may be disposed generally perpendicular to the planes of the generally planar chips so as to connect those conductors on each chip which are exposed through openings in an insulating layer. Where the chip packages are assembled into a stack, electrical connections may be accomplished by lead frames or solder strips extending along the sides of the stack and attached to the electrical contacts of the chips.

One common technique for providing the desired electrical interconnections in a chip stack is to form a stack of chips having bonding pads disposed on the chips adjacent the outer edges thereof. After assembling the stack of chips, the chip edges are ground flat and polished before sputtering an insulating layer thereon. The bonding pads on the edges of the chips are masked during the sputtering process to avoid covering them with the insulating layer. Next, a metal layer is sputtered onto the entire edge of the stack in conjunction with photomasking which forms conductor traces of the metal layer in desired locations for connecting the bonding pads. Procedures such as this are complicated and expensive to carry out.

An example of a vertical stack of IC chips is provided by U.S. Pat. No. 4,956,694 of Floyd Eide, which patent issued Sep. 11, 1990, is entitled "Integrated Circuit Chip Stacking", and is commonly assigned with the present application. The Eide '694 patent describes a stack of chip carriers on a printed circuit board. Each chip carrier packages an IC chip having various terminals. The input/output data terminals, power terminals and ground terminals of the various chips are coupled in parallel, while each chip is capable of being individually accessed to enable the chip.

Another technique for electrically interconnecting the chips in the stack is shown and described in U.S. Pat. No. 5,313,096 of Floyd K. Eide, which patent issued May 17, 1994, is entitled "IC Chip Package Having Chip Attached To And Wire Bonded Within An Overlying Substrate", and is commonly assigned with the present application. The Eide '096 patent describes a chip stack formed from a plurality of chip packages, each of which comprises an IC chip or die of thin, planar configuration mounted on the underside of a relatively thin, planar multi-layer substrate. Contacts at the outer edges of the substrate are electrically connected to the chip through conductors disposed within the substrate and extending to electrical contacts within an aperture in the substrate. The electrical contacts within the aperture are wirebonded to contacts on the upper active surface of the chip in desired fashion. Following that, the aperture in the substrate is filled with epoxy or other filling material which is ground or backlapped to provide an upper surface thereof which is flat and continuous with an upper surface of the substrate opposite the chip. The chip packages may be completed prior to testing to determine optimum placement within a stack to be formed, with a bonding option array of conductors within another aperture in the substrate thereof being used to program the chip package in a desired manner. Upon assembly of the chip packages into a stack, the electrical interconnection thereof is accomplished using conductive films which are formed on the side surfaces of the chip packages in electrical contact with the contacts of the outer edges of the substrates of the chip packages. Solder strips which are then formed in contact with the conductive films and the opposite electrical contacts of each package form an array of parallel conductors.

A common technique for packaging chips for purposes of forming a stack thereof is to encapsulate the chip in a plastic body with the electrical contacts of the chip being wire bonded to leads extending from opposite ends of the body. These so-called thin small outline packages (TSOPs) may then be stacked together and covered with a potting compound to hold the stack together. Grinding the ends thereof exposes the leads of the TSOPs so that metal can be sputtered onto the ground surfaces. After photomasking, the sputtered metal is etched away from desired areas, and the photomasking is then removed. Following that, the stack may be attached to a substrate. This technique for forming a stack of TSOPs involves an 8-step process which is difficult, time consuming and expensive. In addition, the differences in the materials of the chip stack and the substrate require that the stack be coupled to the substrate using flexible electrical leads to provide stress relief as the stack and the substrate expand and contract at different rates in response to changes in ambient temperature.

Thus, while chip stacks of the type described provide various advantages over the earlier chip stack arrangements of the prior art, there is still a need for chip stacks having certain design characteristics. For one thing, it would be desirable to provide a chip stack which is easy to assemble using a simple process involving only a few steps. Also, a chip stack of relatively simple and economical configuration would be desirable. The stack should be easily disassembled in the event that a defective chip must be replaced. The design of the stack should minimize stresses which occur as a result of expansion and contraction of the various materials within the stack and the attached substrate as the ambient temperature changes. A further and desirable feature would be the ability to electrically interconnect the chips in a stack for ease of addressing individual chips, such as to enable them, as well as for common interconnection of other chip terminals.

BRIEF SUMMARY OF THE INVENTION

The foregoing objects and features are achieved in accordance with the invention by providing an integrated circuit chip stack comprised of a stack of chip packages mounted on a substrate. Each chip package includes a packaged chip mounted within a central aperture of a frame and electrically interconnected with conductive pads on the frame. The packaged chip is preferably of thin, planar configuration and may comprise a plastic package such as a thin small outline package (TSOP) having leads at the opposite ends thereof.

The plastic package is mounted within the central aperture of the frame which is also of thin, planar configuration and having conductive pads on an upper surface thereof adjacent to and on opposite sides of the central aperture. The pads at the opposite sides of the central aperture receive the leads at the opposite ends of the plastic package, with the leads being soldered to the conductive pads to mount the plastic package within the frame. Conductive traces on the opposite upper and lower surfaces of the frame combine with vias extending through the frame to couple the conductive pads to which the leads of the plastic package are soldered to other groups of conductive pads mounted on the upper and lower surfaces adjacent outer edges of the frame. The frame is preferably comprised of dielectric printed circuit board material.

In accordance with the invention, a chip stack is formed by assembling together into a stack arrangement a plurality of chip packages formed in the manner described. The edges of the chip stack are dipped into a molten solderpot to solder together the conductive pads on facing surfaces of the chip packages. The soldering holds the stack together in addition to providing the necessary electrical interconnection between the chip packages. The chip stack may then be mounted on a substrate so that conductive pads on an upper surface of the substrate contact the conductive pads on an adjacent one of the chip packages within the stack.

Should it become necessary to replace one of the chips in the stack, this is easily accomplished by unsoldering and separating the chip packages in the stack so that the defective package can be replaced.

By fabricating the frames of printed circuit board material, the frames of the chip packages tend to expand and contract at a rate similar to that of the substrate, in response to changes in ambient temperature. This minimizes stresses between the chip packages and the substrate. Also, by coupling the plastic packages to the frame using the leads at the opposite ends of the plastic package, differences in the rate of expansion and contraction are compensated.

In accordance with the invention, the conductive pads adjacent the outer edges of the chip packages are interconnected in a manner which provides for individual addressing of the chips within the stack as well as providing for common connections. The opposite upper and lower conductive pads adjacent the edges of the chip packages within the stack are arranged into vertical columns of such conductive pads. At one edge of the stack, the upper conductive pad on each chip package is electrically coupled, such as by a via extending through the thickness of the frame, to a conductive pad on the opposite lower surface thereof which is within an adjacent column one column removed from the column in which the upper conductive pad is located. This results in a stair step pattern of interconnections of the conductive pads along the edge of the chip stack. Each of the lower conductive pads within a given vertical column is coupled to the chip enable terminal of the chip within such package. In this manner, the chip enable terminals within the stack are individually accessed by spaced apart conductive pads on the upper surface of the substrate in electrical contact with the spaced apart conductive pads at the lower surface of the lowermost chip package.

BRIEF DESCRIPTION OF THE DRAWINGS

A detailed description of the invention will be made with reference to the accompanying drawings, in which.

DETAILED DESCRIPTION

FIGS. 1–4 show an integrated circuit (IC) chip stack 10 in accordance with the invention. In the present example, the stack 10 is comprised of four different chip packages 12 of like configuration. However, a stack 10 having other numbers of the chip packages 12 therein is possible in accordance with the invention.

After the chip stack 10 is formed in the manner described hereafter, the stack is mounted on a substrate 14. The substrate 14, which has conductive pads on an upper surface thereof, is of conventional printed circuit board design and is typically provided by a customer who purchases the chip stack 10 from the manufacturer thereof. The substrate 14 electrically interacts with various chips in the chip stack 10. In a typical configuration of this type, the various chips within the stack 10 comprise memory chips.

Figure 1:
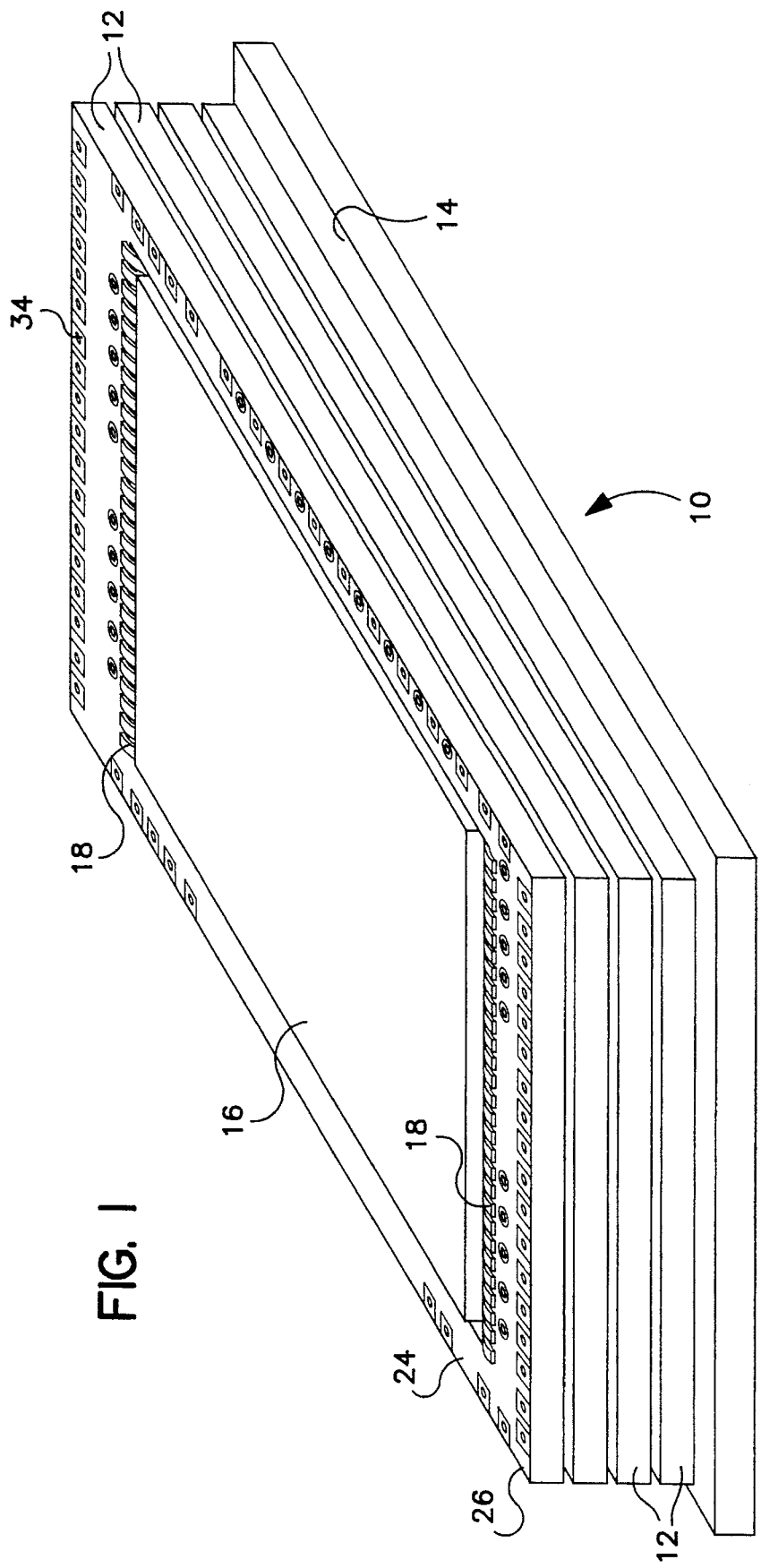
FIG. 1 is a perspective view of a chip stack according to the invention.
Figure 2:
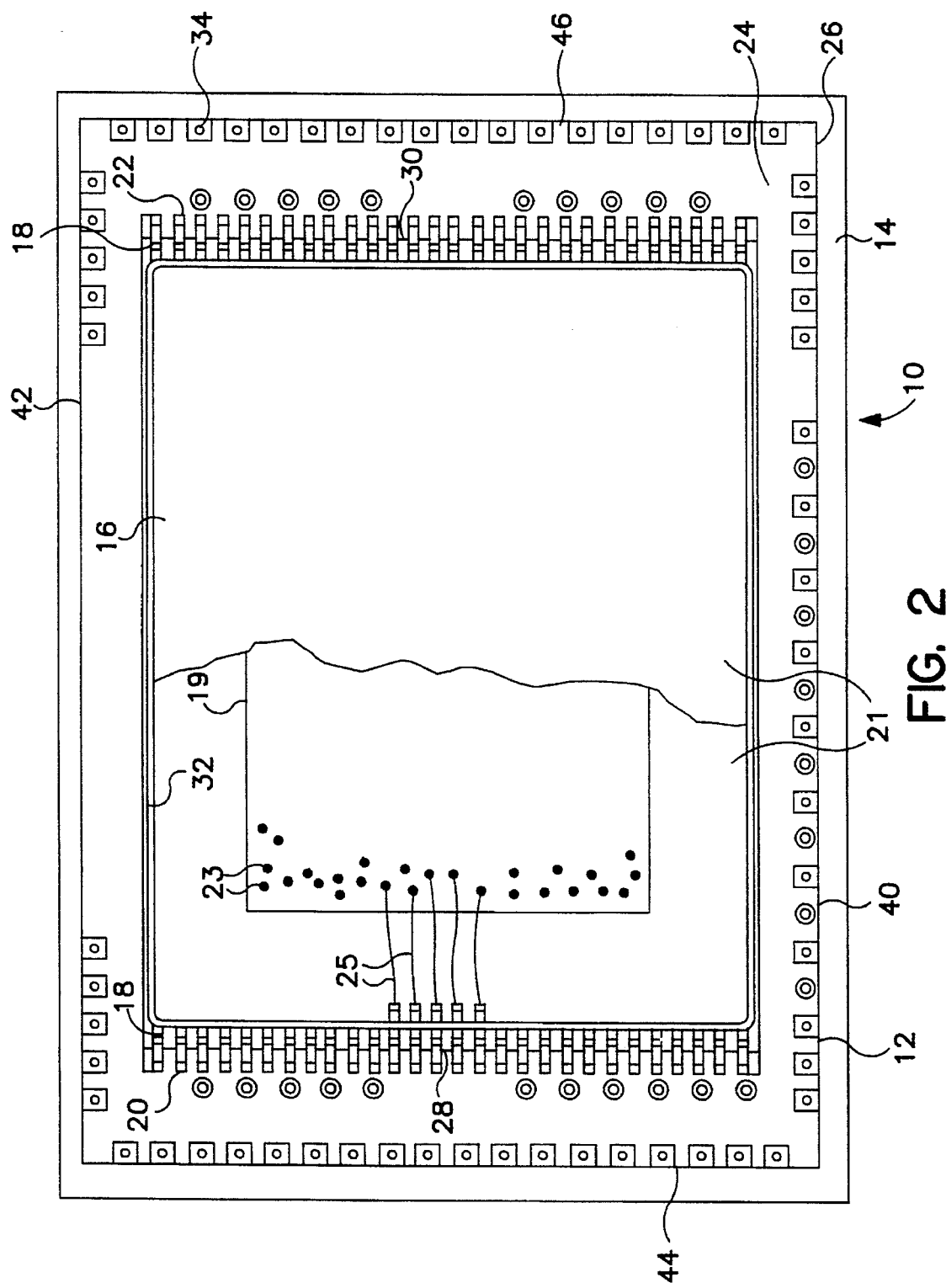
FIG. 2 is a top view of the chip stack of FIG. 1.

FIG. 2 is a top view of the chip stack 10 of FIG. 1, showing in some detail the uppermost one of the chip packages 12 of the stack 10. As shown therein, the chip package 12 is comprised of a packaged integrated circuit chip in the form of a plastic package. In the present example, the plastic package comprises a thin small outline package (TSOP) 16 having leads 18 at the opposite ends thereof. The TSOP package 16 is of conventional configuration, and as shownbroken-away in FIG. 2, comprises an integrated circuit chip or die 19 disposed within a plastic body 21 of thin, planar configuration and having the various electrical contacts 23 thereof coupled by wire bonds 25 to the leads 18 at the opposite ends of the package 16. FIG. 2 shows only a few of the wire bonds 25, for simplicity of illustration. The leads 18 at the opposite ends of the package 16 are soldered to rows of conductive pads 20 and 22 mounted on an upper surface of a thin, planar frame 26 adjacent opposite ends 28 and 30 of a central aperture 32 of rectangular configuration within the frame 26, to mount the package 16 therein. This is described hereafter in greater detail in connection with FIGS. 5–7.

Figure 3:
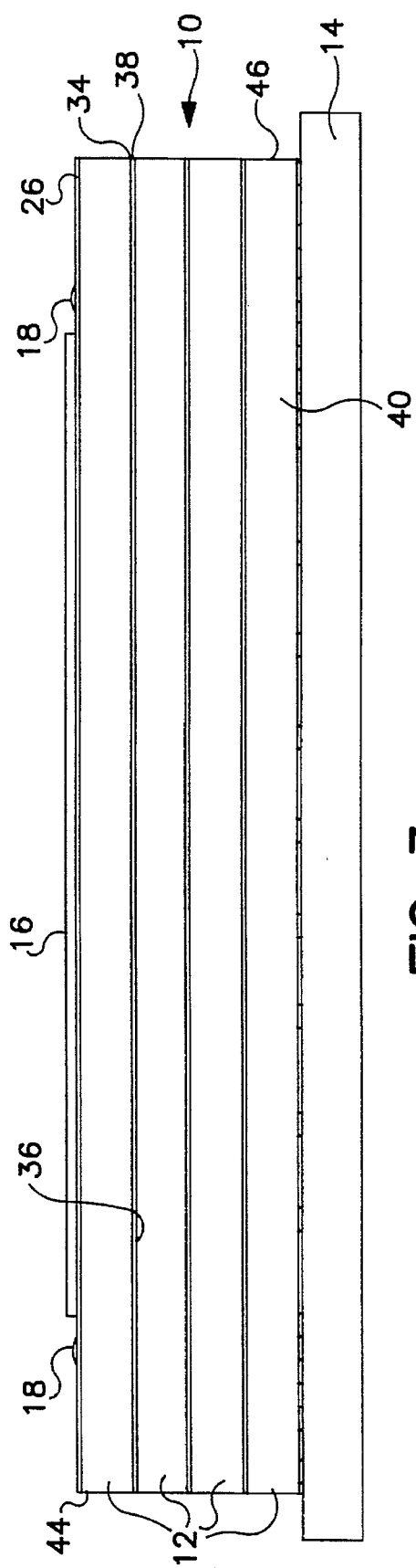
FIG. 3 is a front view of the chip stack of FIG. 1.
Figure 4:
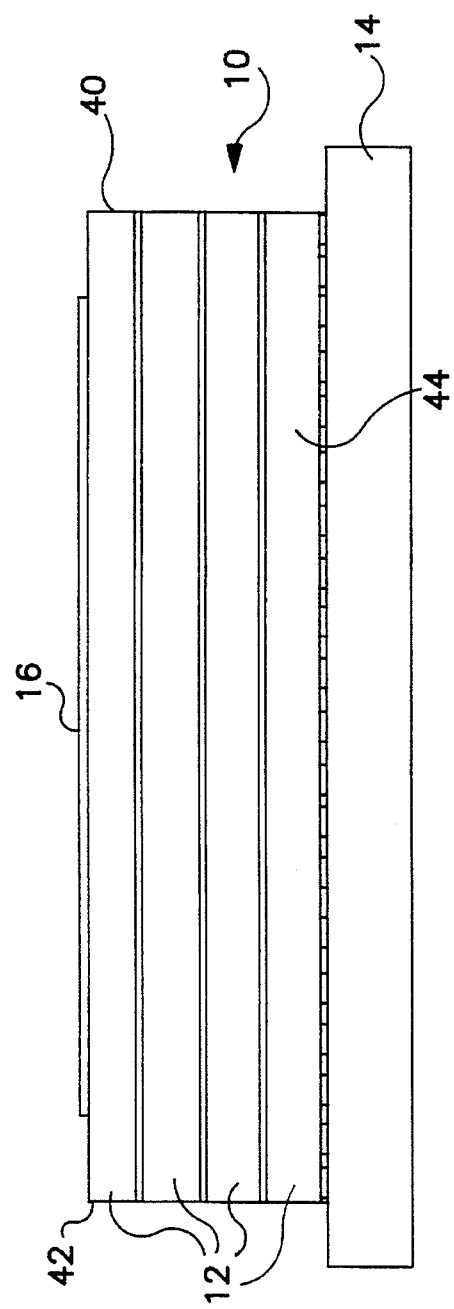
FIG. 4 is an end view of the chip stack of FIG. 1.

In addition to the conductive pads 20 and 22 adjacent the opposite ends 28 and 30 of the central aperture 32 of the frame 26, the upper surface 24 of the frame is provided with a further plurality of conductive pads 34 disposed adjacent the outer edges of the frame 26. The conductive pads 34 are coupled to the conductive pads 20 and 22 by a conductive trace which is omitted from FIG. 2 for reasons of clarity but which is shown and described hereafter in connection with FIG. 8. An opposite lower surface 36 of the frame 26 is provided with a further plurality of conductive pads 38 adjacent the outer edges of the frame 26, as shown in FIGS. 3 and 4. The conductive pads 38 are coupled to the conductive pads 20 and 22 on the upper surface 24 of the frame 26 by a conductive trace and vias, as described hereafter in connection FIGS. 8–10.

After each of the chip packages 12 within the chip stack 10 is formed in a manner described in detail hereafter, a plurality of the chip packages 12 are assembled into the chip stack 10 by dipping the various edges of the stack 10 in molten solder. This solders the conductive pads 38 at the lower surfaces 36 of the frames 26 to the contacting conductive pads 34 at the upper surfaces 24 of the frames 26 of adjacent chip packages 12. As shown in FIGS. 3 and 4, the contacting conductive pads 34 and 38 at the interfaces between adjacent chip packages 12 are bonded together by the solder dipping, and this holds the formed chip stack 10 together. The chip stack 10 is of generally rectangular configuration so as to have opposite front and rear edges 40 and 42 and opposite side edges 44 and 46. Each of the edges 40, 42, 44 and 46 is solder dipped to solder the contacting conductive pads 34 and 38 together.

Figure 5:
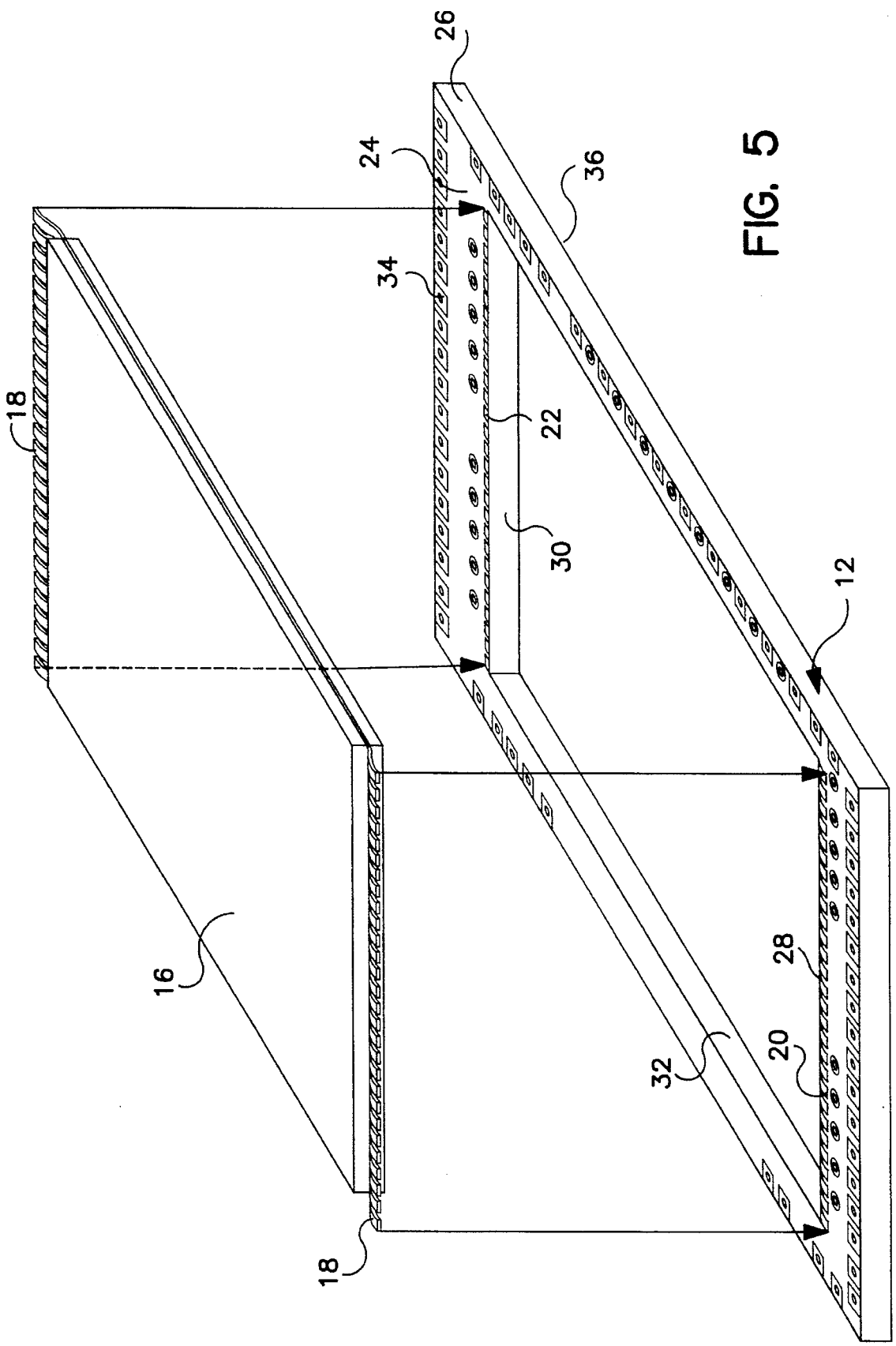
FIG. 5 is an exploded perspective view of one of the chip packages of the stack of FIG. 1, showing the manner in which a plastic package containing the chip is mounted within a central aperture in the frame.
Figure 6:
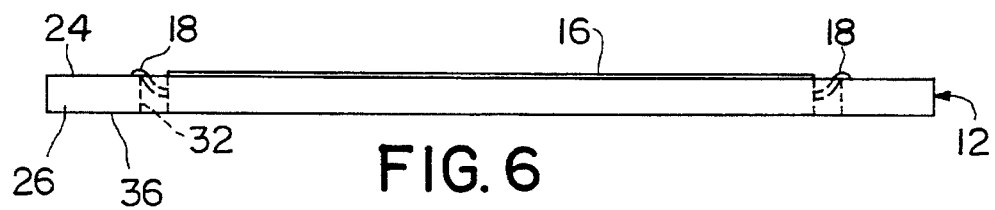
FIG. 6 is a front view of the assembled chip package of FIG. 5.
Figure 7:
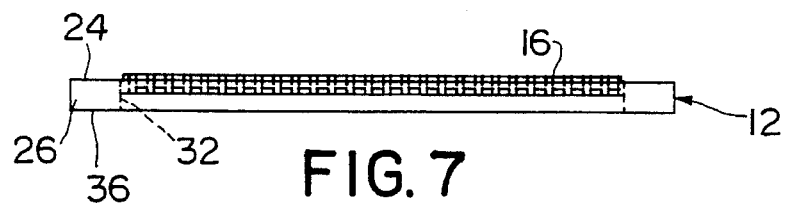
FIG. 7 is an end view of the assembled chip package of FIG. 5.

The manner in which each of the chip packages 12 is formed can be better understood with reference to FIGS. 5–7. As previously described, the package 16, which is of thin, planar configuration, comprises a thin small outline package (TSOP) of conventional configuration. As previously described in connection with FIG. 2, each such package 16 comprises the integrated circuit chip 19 imbedded within the plastic body 21 forming the thin, planar configuration of the package 16, with the electrical contacts 23 of the chip 19 being coupled by wire bonds 25 to the leads 18 at the opposite ends of the package 16. The package 16 is mounted within the frame 26 by being disposed in the central aperture 32 so that the leads 18 at the opposite ends reside on the conductive pads 20 and 22 at the opposite ends 28 and 30 of the central aperture 32. The leads 18 are soldered to the conductive pads 20 and 22, such as by applying soldering paste to the conductive pads 20 and 22 and passing the resulting assembly of the package 16 and the frame 26 through a reflow furnace.

As shown in FIGS. 6 and 7, the package 16 resides within the central aperture 32 in the frame 26 so as to protrude only slightly above the upper surface 24 of the frame 26. The package 16 is essentially co-planar with the lower surface 36 of the frame 26. A small space exists between the walls of the central aperture 32 and the outer edges of the package 16 to permit small amounts of movement of the package 16 within the central aperture 32. The leads 18 flex as necessary to permit such small amounts of movement in response to stresses which may occur as the package 16 and the frame 24 expand and contract at different rates in response to changes in the ambient temperature. At the same time, the frame 24 is preferably made of a printed circuit board-type material so as to expand and contract at a rate similar to the package 16 and the substrate 14. By making the frame 26 and the substrate 14 of like material, stresses between the lowermost chip package 12 and the substrate 14 are minimized if not eliminated entirely. Examples of dielectric materials which may be used for the frame 26 include FR-4 as well as various ceramics typically used in the construction of printed circuit boards.

Figure 8:
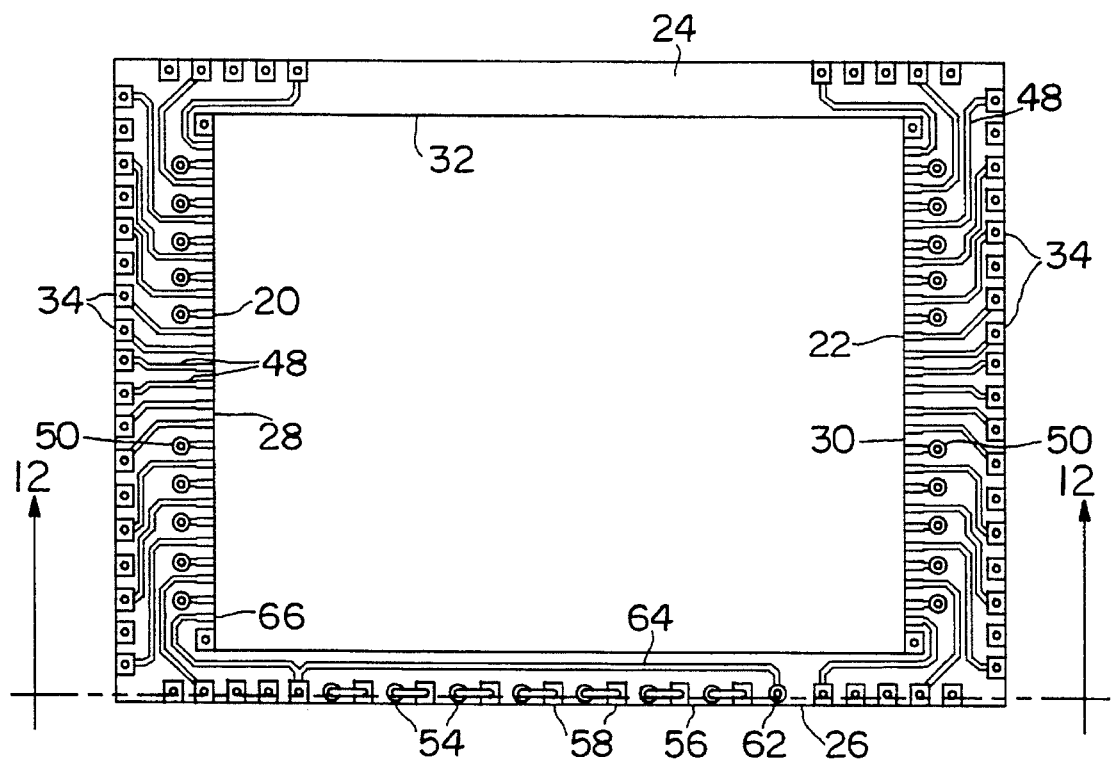
FIG. 8 is a top view of the frame of the chip package of FIG. 5, showing the conductive trace thereon for interconnecting the various conductive pads.
Figure 9:
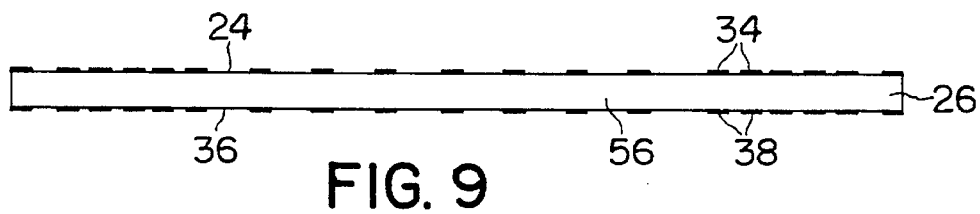
FIG. 9 is a front view of the frame of FIG. 8.
Figure 10:
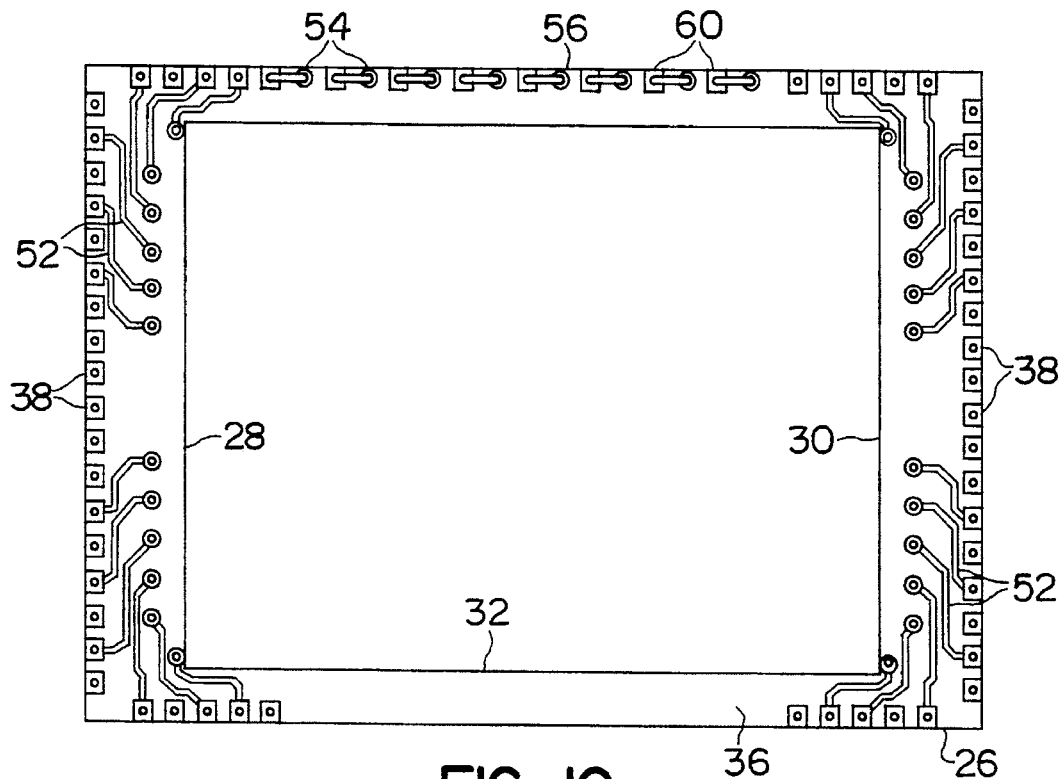
FIG. 10 is a bottom view of the frame of FIG. 8, showing the conductive trace thereon for interconnecting the various conductive pads of the frame.

FIGS. 8, 9 and 10 comprise top, front edge and bottom views, respectively, of the frame 26. FIG. 8 shows the upper surface 24 which is provided with a conductive trace 48. The conductive trace 48, which is not shown in FIG. 2 for simplicity of illustration, couples the conductive pads 20 and 22 to selected ones of the conductive pads 34 as well as to selected ones of a plurality of vias 50. The vias 50 extend through the thickness of the frame 24 and are coupled to selected ones of the conductive pads 38 at the lower surface 36 of the frame 26 by a conductive trace 52 on the lower surface 36, as shown in FIG. 10. Basically, alternate ones of the conductive pads 20 and 22 on the upper surface 24 of the frame 26 are coupled to alternate ones of the conductive pads 34, with intervening ones of the conductive pads 20 and 22 being coupled to the vias 50. The vias 50, in turn, are coupled to alternate ones of the conductive pads 38 at the lower surface 36 of the frame 26.

The vias 50 are located between the conductive pads 20 and 22 and adjacent ones of the conductive pads 34 and 38 on the upper and lower surfaces 24 and 36 of the frame 26. The frame 26 is also provided with a plurality of vias 54 adjacent a front edge 56 thereof. The vias 54, which extend through the thickness of the frame 26 adjacent the front edge 56 thereof, couple each of a plurality of conductive pads 58 on the upper surface 24 adjacent the front edge 56 to a different one of a plurality of conductive pads 60 on the lower surface 36 adjacent the front edge 56. The conductive pads 58 and 60 are shown in FIGS. 8 and 10, respectively, as well as in FIG. 9.

As described in greater detail hereafter in connection with FIG. 12, each conductive pad 58 is coupled to a conductive pad 60 which is offset from rather than disposed immediately below the conductive 58. Again, these connections are made by the vias 54 which extend through the thickness of the frame 26 adjacent the front edge 56 thereof. One of the vias 62 adjacent the front edge 56 is coupled by a trace 64 to a chip enable terminal 66 formed by one of the conductive pads 20. The chip enable terminal 66 is coupled to the chip enable contact of the chip within the package 16.

Figure 11:
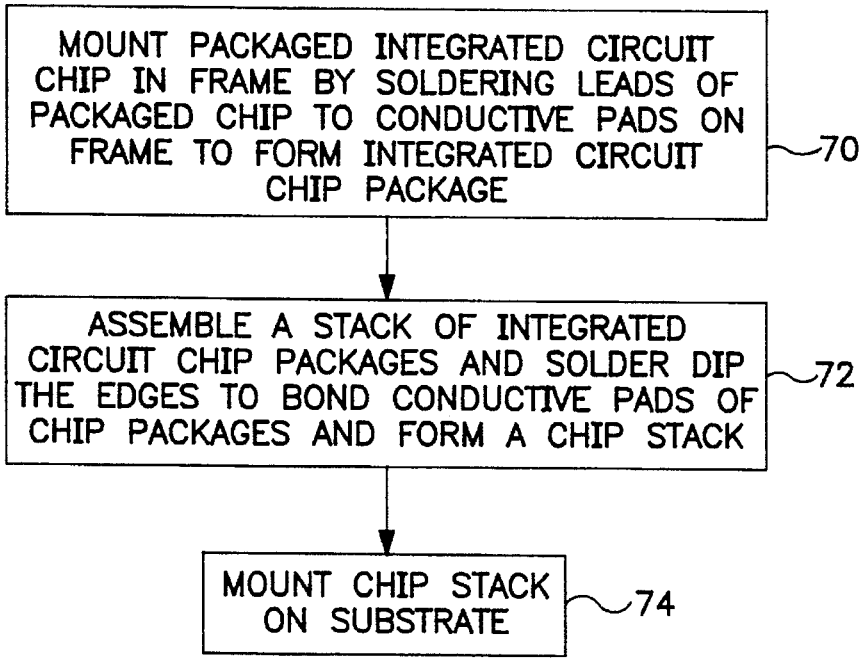
FIG. 11 is a block diagram of the successive steps in a method of making a chip stack according to the invention.

The successive steps of a method of making the chip stack 10 in accordance with the invention are shown in FIG. 11. In a first step 70, the packaged integrated circuit chips in the form of the TSOP packages 16 are mounted in the central apertures 32 of the frames 26 to form a plurality of the integrated circuit chip packages 12. The packages 16 are mounted within the central apertures 32 by soldering the leads 18 at the opposite ends thereof to the conductive pads 20 and 22 on the upper surfaces 24 of the frames 26, in the manner previously described.

In a second step 72, shown in FIG. 11, a plurality of the formed chip packages 12 are assembled into a stack, with the edges 40, 42, 44 and 46 of the stack being solder dipped to bond the facing conductive pads 34 and 38 of the packages 12 together, to form the chip stack 10.

The two-step process comprised of the first and second steps 70 and 72, shown in FIG. 11, is a simple and effective manner of assembling the chip stack 10 in accordance with the invention. Thereafter, the assembled chip stack can be mounted on the substrate 14, in a third step 74.

The method in accordance with the invention, as illustrated in FIG. 11, facilitates replacement of a bad chip or chip package within an assembled chip stack. It is only necessary to melt the solder which bonds together the conductive pads and at the outer edges of the stack in order to disassemble the stack and remove the defective chip package. The defective chip package is replaced by a new chip package, and the edges of the assembled stack are solder dipped to join them together.

As previously noted, small spaces between the outer edges of the package 16 and the walls of the central aperture 32 within the frame 26, and the ability of the leads 18 to flex as necessary, prevent stresses from occurring as a result of unequal expansion and contraction of the package 16 and the frame 26 in response to changes in ambient temperature. Moreover, because the frames 24 and the substrate 14 are made of like, printed circuit board-type material, the frames 26 and the substrate 14 tend to expand and contract at essentially the same rate in response to changes in ambient temperature. This enables the lowermost one of the chip packages 12 within the stack 10 to be mounted directly onto the upper surface of the substrate 14, and without the use of flexible leads or other standard stress-relieving measures.

Figure 12:
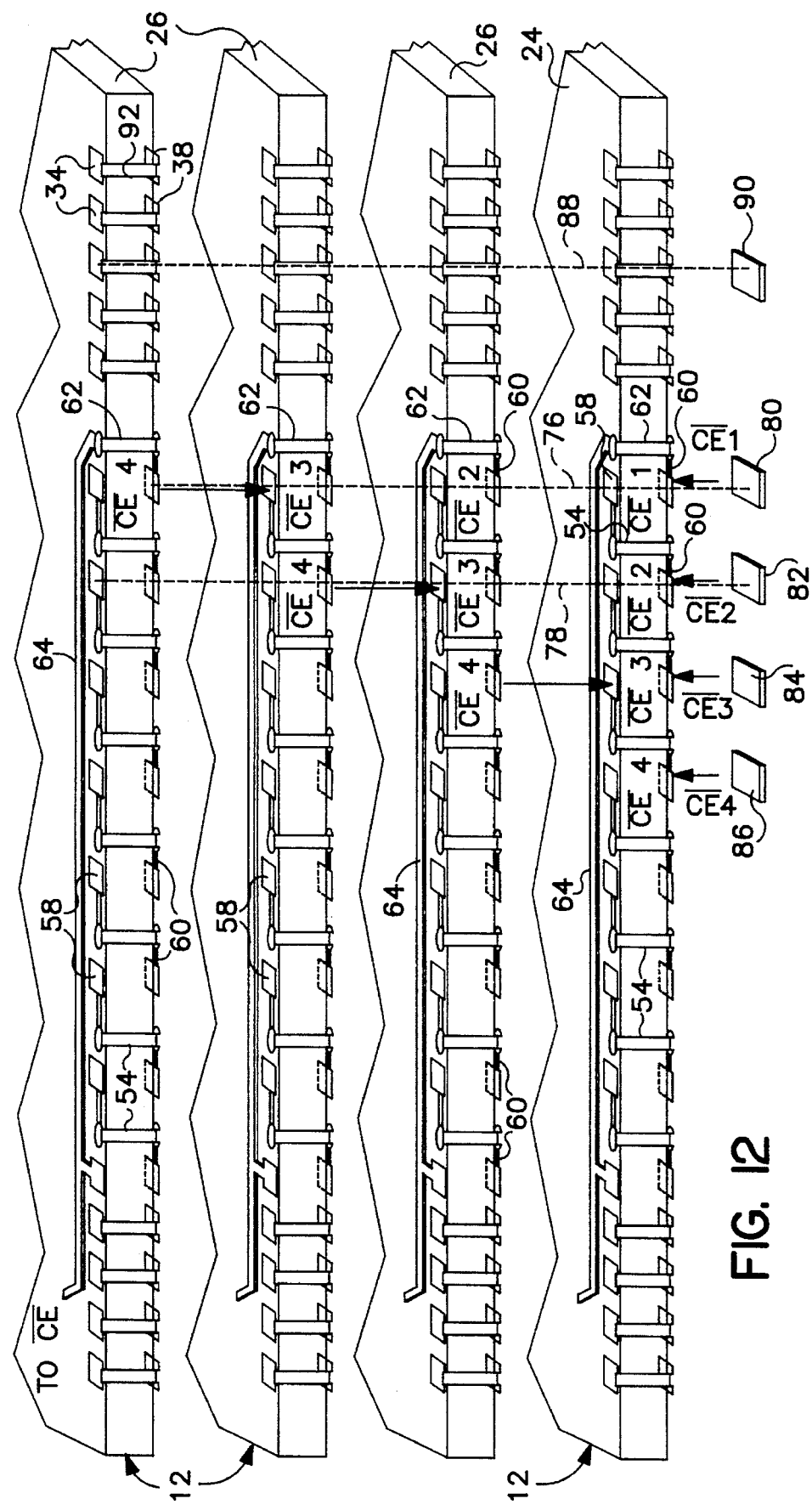
FIG. 12 is an exploded perspective view of a portion of the chip stack of FIG. 1, with each chip package shown in section as taken along the line 12—12 of FIG. 8, and showing the stair step pattern of conductive pad interconnection in accordance with the invention.

The manner in which the upper conductive pads 58 and the lower conductive pads 60 are coupled together in stair step fashion at the front edge 56 of the frame 26 of each chip package 12 within the stack 10 is shown in detail in FIG. 12. In FIG. 12, the chip packages 12 are shown spaced apart from each other, for clarity of illustration. In addition, each chip package 12 is shown in section, taken along the line 12—12 of FIG. 8, in order to better illustrate the manner in which the vias 54 couple the upper conductive pads 58 to lower conductive pads 60 which are offset therefrom. Within each chip package 12, each of the upper conductive pads 58 is located directly above a different one of the lower conductive pads 60, so as to form vertical columns of the conductive pads 58 and 60 within the chip stack 10. One such vertical column is represented by a dashed line 76 in FIG. 12. Within the column 76, each of the lower conductive pads 60 is coupled by the via 62 to the trace 64 for coupling to the chip enable terminal within the respective chip package 12. At the same time, the upper conductive pads 58 within the column 76 are coupled by the via 54 to the lower conductive pads 60 within an adjacent column, one position removed, as represented by a dashed line 78. This stair step configuration of interconnections permits the chip enable terminal of each chip package 12 to be independently addressed using conductive pads at the upper surface of the substrate 14. The chip enable conductive pads for the different chip packages 12 are located in spaced apart fashion along the upper surface of the substrate 14.

In the present example, consisting of four of the chip packages 12, the upper surface of the substrate 14 is provided with four chip enable conductive pads 80, 82, 84 and 86, as shown in FIG. 12. The first conductive pad 80 provides a chip enable signal $\overline{CE}$ 1 to the lower conductive pad 60 of the lowermost chip package 12 which lies within the first column 76. The chip enable signal $\overline{CE}$ 1 is passed via the lower conductive pad 60 and the connecting via 62 to the trace 64 on the upper surface 24 of the lowermost chip package 12, to enable the chip within the lowermost chip package 12. The conductive pad 82 provides a chip enable signal $\overline{CE}$ 2 to an adjacent one of the lower conductive pads 60 on the lowermost chip package 12. The connecting via 54 passes such signal to the upper conductive pad 58 on the lowermost chip package 12 and which is within the first column 76. This routes the signal $\overline{CE}$ 2 to the lower conductive pad 60 of the next higher chip package 12, which lower conductive pad 60 is within the first column 76. The attached via 62 passes the signal $\overline{CE}$ 2 to the trace 64 of such next higher chip package 12 so as to enable the chip therein. In similar fashion, the conductive pads 86 and 84 on the upper surface of the substrate 14 enable chips within the uppermost chip package 12 and the chip package 12 immediately therebelow, so that the chip enable signals $\overline{CE}$ 4 and $\overline{CE}$ 3 provided thereby are routed to the chips of such chip packages 12.

The stair step interconnection of the conductive pads can be used with chip stacks having other numbers of the chip packages 12. For example, if a chip stack 10 is formed with five of the chip packages 12 so as to place a fifth such chip package 12 above the uppermost chip package 12 shown in FIG. 12, then an additional conductive pad located just to the left of the conductive pad 86 is provided on the upper surface of the substrate 14 so as to control enabling the chip of the uppermost chip package 12 in the resulting 5-package stack.

The conductive pads 34 and 38 on the upper and lower surfaces 24 and 36 of the various frames 26 within the chip stack 10 are coupled in common. Such conductive pads are arranged into vertical columns for the common coupling thereof, as represented, for example by a dashed line 88 shown in FIG. 12. Within the vertical column 88, the upper and lower conductive pads 34 and 38 within each chip package 12 are coupled together by vertically disposed vias 92. Inasmuch as the lower conductive pad of each chip package 12 within the column 80 is soldered to the upper conductive pad of the immediately below chip package 12, within the column 88, the various conductive pads within the column 88 are coupled together to form a common connection. This common connection is coupled to a conductive pad 90 on the upper surface of the substrate 14 and located within the column 88.

Thus, the various upper and lower conductive pads 34 and 38 within the various chip packages 12 are coupled in common along vertical columns in the manner just described. At the same time, the stair step interconnection of the conductive pads 58 and 60 at the front edge 56 of each chip package 12 enables the chip packages 12 to be individually addressed, such as for purposes of chip enabling.

While the invention has been particularly shown and described with reference to a preferred embodiment thereof, it will be understood by those skilled in the art that various changes in form and details may be made therein without departing from the spirit and scope of the invention.

What is claimed is:

1. An integrated circuit chip package comprising the combination of:

a thin, small outline package comprised of an integrated circuit chip encapsulated in a plastic body of relatively thin, generally planar configuration and having leads extending from opposite ends of the plastic body and electrically coupled by wire bonds to contacts on the chip; and a relatively thin, generally planar frame having opposite, generally planar surfaces and having a central aperture therein defined by side walls thereof, the frame having a plurality of conductive pads disposed thereon adjacent an opposite pair of the side walls and electrically coupled to the leads extending from opposite ends of the plastic body to mount the thin, small outline package within the central aperture in the frame, and to support the thin, small outline package by the frame, the plastic body being spaced apart from the side walls of the central aperture and having opposite, generally planar surfaces which are generally coplanar with the opposite, generally planar surfaces of the frame.

2. An integrated circuit chip package in accordance with claim 1, wherein the opposite, generally planar surfaces of the frame define upper end lower surfaces thereof, the plurality of conductive pads are disposed on the upper surface of the frame, the frame has a plurality of outer edges extending between the upper and lower surfaces, and further including a second plurality of conductive pads mounted on the upper surface of the frame adjacent a plurality of the outer edges and coupled to selected ones of the leads and a third plurality of conductive pads mounted on the lower surface of the frame adjacent a plurality of the outer edges and coupled to selected ones of the leads.

3. An integrated circuit chip package in accordance with claim 2, wherein selected ones of the third plurality of conductive pads mounted on the lower surface of the frame are coupled to selected ones of the leads through vias extending through the frame between the upper and lower surfaces.

4. An integrated circuit chip package in accordance with claim 2, wherein the individual conductive pads of the second plurality of conductive pads are disposed directly opposite individual conductive pads of the third plurality of conductive pads, and selected ones of the second plurality of conductive pads are coupled to selected ones of the third plurality of conductive pads which are one position removed from the directly opposite conductive pad.

5. A chip stack comprising the combination of:

a plurality of integrated circuit chip packages formed into a stack, each of the chip packages including an integrated circuit chip and a frame, said integrated circuit chip being mounted within said frame and said integrated circuit chip being electrically coupled to conductive pads on opposite upper and lower surfaces of the frame, the conductive pads on the upper surfaces of the frames of at least some of the plurality of chip packages being soldered to the conductive pads on the lower surface of the frames of at least some of the plurality of chip packages to hold the chip stack together and provide electrical interconnection between the chip packages, each of the plurality of integrated circuit chip packages, including the conductive pads on the opposite upper and lower surfaces of the frame thereof, being of identical configuration to the other chip packages in the stack and being individually addressable to the exclusion of the other chip packages in the stack.

6. A chip stack in accordance with claim 1, further including a substrate mounting the plurality of chip packages thereon and electrically coupled to conductive pads on the lower surface of the frame of a bottom one of the plurality of chip packages.

7. A chip stack in accordance with claim 6, wherein the frames of the plurality of chip packages and the substrate are made of like, printed circuit board material, so that the frame of the bottom one of the plurality of chip packages and the substrate have like coefficients of thermal expansion.

8. A chip stack in accordance with claim 5, wherein, in each of the plurality of chip packages, the integrated circuit chip comprises a thin, small outline packaged chip disposed substantially completely within and spaced from the walls of a central aperture in the frame and having a plurality of leads at opposite ends thereof extending from the thin, small outline package and soldered to conductive pads on an upper surface of the frame so that the chip is supported by the frame.

9. A chip stack comprising the combination of:

a plurality of integrated circuit chip packages formed into a stack and each including an integrated circuit chip mounted within a frame and electrically coupled to conductive pads on opposite upper and lower surfaces of the frame, the conductive pads on the upper surfaces of the frames of at least some of the plurality of chip packages being soldered to the conductive pads on the lower surface of the frames of at least some of the plurality of chip packages to hold the chip stack together and provide electrical interconnection between the chip packages, each of the plurality of integrated circuit chip packages, including the conductive pads on the opposite upper and lower surfaces of the frame thereof, being of identical configuration to the other chip packages in the stack and being individually addressable to the exclusion of the other chip packages in the stack;

wherein the frames have conductive pads on the opposite upper and lower surfaces thereof arranged into a plurality of spaced apart columns along an edge of the chip stack, with each conductive pad on the upper surface of each frame lying within a column and being coupled through the frame to a conductive pad on the opposite lower surface of the frame and within an adjacent column, to form a stair step configuration of interconnected conductive pads at the edge of the chip stack, whereby the chip packages of identical configuration within the stack are individually addressable.

10. A chip stack in accordance with claim 9, wherein the conductive pads on the lower surfaces of the frames within a given column are each coupled to a chip enable terminal of the integrated circuit chip mounted within the frame, whereby the chip packages of identical configuration. Within the stack may be individually enabled to the exclusion of the other chip packages in the stack.

11. A method of making a chip stack comprising the steps of:

providing a plurality of frames of like configuration and a plurality of thin, small outline packages of like configuration, each of the frames having a central aperture therein and a plurality of conductive pads on opposite surfaces thereof, the conductive pads on opposite surfaces forming like patterns thereof on each of the plurality of frames and each of the thin, small outline packages having a plurality of leads;

mounting each of the plurality of thin, small outline packages within the central aperture of a different one of the plurality of frames by electrically and mechanically coupling the leads thereof to some of the conductive pads of the flame, to form a plurality of integrated circuit chip packages of like configuration, the thin, small outline package being substantially completely contained within the central aperture of the frame and being spaced from sidewalls extending through a thickness of the frame to form the central aperture, to permit movement of the thin, small outline package relative to the flame in response to different rates of thermal expansion of the thin, small outline package and the flame; and assembling the plurality of integrated circuit chip packages into a stack and bonding conductive pads of adjacent ones of the flames together to secure the integrated circuit chip packages together.

12. A method of making a chip stack in accordance with claim 11, wherein the plurality of frames provided are of like material, and comprising the further steps of providing a substrate made of the like material of the plurality of frames and mounting the stack on the substrate.

13. A method of making a chip stack in accordance with claim 11, wherein the leads of each thin, small outline package are coupled to some of the conductive pads on the frame by soldering, and the conductive pads of adjacent ones of the frames are bonded together by dipping the edges of the stack of integrated circuit chip packages in solder.

14. A method of making a chip stack in accordance with claim 11, wherein the step of providing a plurality of frames includes arranging at least some of the plurality of conductive pads on opposite surfaces thereof to form columns of conductive pads generally parallel to each other and to one of the relatively flat side surfaces and coupling selected ones of the conductive pads on one of the opposite surfaces to conductive pads in adjacent ones of the columns and which are on the opposite one of the opposite surfaces.

15. A chip stack arrangement comprising the combination of:

a plurality of integrated circuit chip packages having opposite, relatively flat surfaces disposed adjacent each other to form a stack thereof having a relatively flat upper surface formed by a relatively flat surface of an uppermost one of the chip packages and a relatively flat lower surface formed by a relatively flat surface of a lowermost one of the chip packages and being generally parallel to the upper surface, each of the packages having first and second pluralities of conductive pads mounted on the opposite, relatively flat surfaces thereof opposite each other and in contact with conductive pads of an adjacent package and coupled to an integrated circuit chip within the package, the plurality of chip packages being of like configuration and the first and second pluralities of conductive pads being arranged in like patterns on the plurality of chip packages, the first and second pluralities of conductive pads of the packages being arranged into a plurality of columns which are generally parallel to each other and generally perpendicular to the upper and lower surfaces, with a respective conductive pad in the first plurality of conductive pads of a package lying within one of the columns and being coupled to a conductive pad in the second plurality of conductive pads of the package lying within a column adjacent said one of the columns, whereby some of the conductive pads of the various packages are coupled together in stair step fashion at a relatively, flat edge of the chip stack which extends between and is generally perpendicular to the upper and lower surfaces, to provide for individual addressing of each of the chip packages of like configuration to the exclusion of other ones of the plurality of chip packages.

16. A chip stack arrangement comprising the combination of:

a plurality of integrated circuit chip packages having opposite, relatively flat surfaces disposed adjacent each other to form a stack thereof, each of the packages having first and second pluralities of conductive pads mounted on the opposite, relatively flat surfaces thereof opposite each other and in contact with conductive pads of an adjacent package and coupled to an integrated circuit chip within the package, the plurality of chip packages being of like configuration and the first and second pluralities of conductive pads being arranged in like patterns on the plurality of chip packages, the first and second pluralities of conductive pads of the packages being arranged into a plurality of relatively parallel columns with a respective conductive pad in the first plurality of conductive pads of a package lying within one of the columns and being coupled to a conductive pad in the second plurality of conductive pads of the package lying within a column adjacent said one of the columns, whereby some of the conductive pads of the various packages are coupled together in stair step fashion at an edge of the chip stack to provide for individual addressing of each of the chip packages of like configuration to the exclusion of other ones of the plurality of chip packages;

wherein a respective conductive pad in the first plurality of conductive pads of a package lying within one of the columns is coupled to a conductive pad in the second plurality of conductive pads of the package lying within a column adjacent said one of the columns by a via extending through the package between the opposite, relatively flat surfaces thereof.

17. A chip stack arrangement in accordance with claim 15, wherein within a given one of the columns, the conductive pad within the second plurality of conductive pads of each package is coupled to a chip enable terminal of the integrated circuit chip of the package to provide for individual enabling of each of the chip packages of like configuration to the exclusion of other ones of the plurality of chip packages.

18. A chip stack arrangement in accordance with claim 17, further including a substrate coupled to the chip stack and having a plurality of spaced apart chip enable conductive pads on a surface thereof in contact with different ones of spaced apart conductive pads on the lower surface of the stack formed by a relatively flat surface of a lowermost one of the chip packages.

\* \* \* \* \*

UNITED STATES PATENT AND TRADEMARK OFFICE
CERTIFICATE OF CORRECTION

PATENT NO.   : 5,612,570
DATED        : March 18, 1997
INVENTOR(S)  : Floyd K. Eide, et al.

It is certified that error appears in the above-indentified patent and that said Letters Patent is hereby corrected as shown below:

Column 10, lines 30-31, delete "configuration. Within" and substitute therefor --configuration within--.

Column 10, line 47, delete "flame" and substitute therefor --frame--.

Column 10, line 54, delete "flame" and substitute therefor --frame--.

Column 10, line 56, delete "flame" and substitute therefor --frame--.

Column 10, line 59, delete "flames" and substitute therefor --frames--.

Column 11, line 43, delete "relatively, flat" and substitute therefor --relatively flat--.

Signed and Sealed this

Seventeenth Day of June, 1997

Attest:

Attesting Officer

BRUCE LEHMAN

Commissioner of Patents and Trademarks